US009603271B2

(12) United States Patent
Lee et al.

(10) Patent No.: US 9,603,271 B2
(45) Date of Patent: Mar. 21, 2017

(54) FOLDABLE DISPLAY APPARATUS

(71) Applicant: LG DISPLAY CO., LTD., Seoul (KR)

(72) Inventors: Dal Jae Lee, Seoul (KR); Su Chan Kwon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 73 days.

(21) Appl. No.: 14/584,605

(22) Filed: Dec. 29, 2014

(65) Prior Publication Data
US 2015/0257289 A1 Sep. 10, 2015

(30) Foreign Application Priority Data

Mar. 7, 2014 (KR) ........................ 10-2014-0027403

(51) Int. Cl.
| | |
|---|---|
| *H05K 5/02* | (2006.01) |
| *H05K 5/00* | (2006.01) |
| *G09F 9/30* | (2006.01) |
| *G06F 1/16* | (2006.01) |
| *H05K 1/02* | (2006.01) |
| *H04M 1/02* | (2006.01) |

(52) U.S. Cl.
CPC ......... *H05K 5/0226* (2013.01); *G06F 1/1641* (2013.01); *G06F 1/1652* (2013.01); *G09F 9/301* (2013.01); *H04M 1/0268* (2013.01); *H05K 5/0017* (2013.01); *H05K 5/0021* (2013.01); *G06F 1/1681* (2013.01); *H04M 1/022* (2013.01); *H04M 1/0216* (2013.01); *H05K 1/028* (2013.01); *H05K 2201/10128* (2013.01); *H05K 2201/2009* (2013.01)

(58) Field of Classification Search
CPC combination set(s) only.
See application file for complete search history.

(56) References Cited

U.S. PATENT DOCUMENTS 6,377,324 B1 * 4/2002 Katsura ............. G02F 1/133305
349/58
6,577,496 B1 * 6/2003 Gioscia ................. G06F 1/1616
345/156

(Continued)

FOREIGN PATENT DOCUMENTS

| CN | 101681183 A | 3/2010 |
|---|---|---|
| CN | 101689066 A | 3/2010 |

(Continued)

*Primary Examiner* — Lisa Lea Edmonds
(74) *Attorney, Agent, or Firm* — Birch, Stewart, Kolasch & Birch, LLP

(57) ABSTRACT

A foldable display apparatus including a display panel configured to include a display area including a first display area, a second display area, and a bending area, a first panel supporting member configured to support a first area of the display panel corresponding to the first display area, a second panel supporting member configured to support a second area of the display panel corresponding to the second display area, and a folding part connected between the first and second panel supporting members to overlap the bending area and configured to guide the display panel for the display panel to be folded or unfolded to a plane state with respect to the bending area. The folding part adjusts a distance between the first and second panel supporting members for the display panel to be folded or unfolded.

14 Claims, 4 Drawing Sheets

(56) References Cited

U.S. PATENT DOCUMENTS

| | | | |
|---|---|---|---|
| 7,202,906 B2 * | 4/2007 | Ijas | G06F 1/1616 348/375 |
| 7,548,415 B2 * | 6/2009 | Kim | G06F 1/1601 345/1.1 |
| 7,830,333 B2 * | 11/2010 | Aoki | G06F 1/1601 345/1.3 |
| 7,965,258 B2 * | 6/2011 | Aoki | G06F 1/1601 345/1.3 |
| 8,120,899 B2 * | 2/2012 | Kim | G06F 1/1601 345/1.1 |
| 8,582,049 B2 * | 11/2013 | Shim | G06F 1/1652 349/58 |
| 8,804,349 B2 * | 8/2014 | Lee | G06F 1/1641 361/679.01 |
| 8,842,425 B2 * | 9/2014 | Ryu | G06F 1/1601 361/679.21 |
| 8,971,032 B2 * | 3/2015 | Griffin | G06F 1/1616 345/156 |
| 9,013,864 B2 * | 4/2015 | Griffin | H04M 1/0216 16/382 |
| 9,119,316 B2 * | 8/2015 | Lee | H05K 7/16 |
| 9,173,287 B1 * | 10/2015 | Kim | H05K 1/028 |
| 9,173,288 B1 * | 10/2015 | Kim | G06F 1/1633 |
| 9,179,559 B1 * | 11/2015 | Kim | G06F 1/1616 |
| 9,204,565 B1 * | 12/2015 | Lee | E05D 7/00 |
| 9,250,733 B2 * | 2/2016 | Lee | H04M 1/02 |
| 9,294,597 B2 * | 3/2016 | Tan | H04M 1/0268 |
| 2002/0016191 A1 * | 2/2002 | Ijas | G06F 1/1616 455/575.3 |
| 2008/0078055 A1 | 4/2008 | Estlander | |
| 2010/0064564 A1 | 3/2010 | Bemelmans et al. | |
| 2010/0201604 A1 * | 8/2010 | Kee | G06F 1/1616 345/1.3 |
| 2010/0246113 A1 | 9/2010 | Visser et al. | |
| 2011/0063783 A1 * | 3/2011 | Shim | G06F 1/1615 361/679.01 |
| 2011/0128216 A1 * | 6/2011 | Renwick | G06F 1/1618 345/156 |
| 2012/0044620 A1 | 2/2012 | Song et al. | |
| 2014/0355195 A1 * | 12/2014 | Kee | G06F 1/1616 361/679.27 |
| 2015/0146349 A1 * | 5/2015 | Choi | G06F 1/1677 361/679.01 |
| 2015/0153780 A1 * | 6/2015 | Maatta | G06F 1/1656 361/679.27 |
| 2015/0330614 A1 * | 11/2015 | Lee | F21V 21/30 362/97.1 |
| 2016/0085271 A1 * | 3/2016 | Morrison | G06F 1/1681 361/679.27 |

FOREIGN PATENT DOCUMENTS

| | | |
|---|---|---|
| EP | 1 603 309 A1 | 12/2005 |
| EP | 2 421 231 A1 | 2/2012 |

\* cited by examiner

FOLDABLE DISPLAY APPARATUS

CROSS-REFERENCE TO RELATED APPLICATIONS

This application claims the benefit of the Korean Patent Application No. 10-2014-0027403 filed in the Republic of Korea on Mar. 7, 2014, which is hereby incorporated by reference as if fully set forth herein.

BACKGROUND OF THE INVENTION

Field of the Invention

The present invention relates to a foldable display apparatus, and more particularly, to a foldable display apparatus for minimizing stress applied to a bending area of a display panel.

Discussion of the Related Art

A display apparatus using a flat display panel, such as a liquid crystal display (LCD) apparatus, a plasma display apparatus, an organic light emitting display apparatus, an electrophoretic display apparatus, or an electro-wetting display apparatus, is generally applied to notebook computers, portable electronic devices, televisions (TVs), and monitors.

Recently, even in portable electronic devices, the demand for a large screen is increasing, and thus, an apparatus including a display unit displaying a large screen is being developed and commercialized by connecting a flat display panel. In particular, foldable display apparatuses using the merits of a flexible display panel which is bendable or foldable provide portable convenience and include a display unit which displays a large screen, and thus are attracting much attention as next-generation technology of the display field. The foldable display apparatus may be applied to various fields such as TVs and monitors, in addition to portable electronic devices such as mobile communication terminals, electronic notes, e-books, portable multimedia players (PMPs), navigation devices, ultra mobile personal computers (PCs), mobile phones, smartphones, tablet PCs.

Examples of the foldable display apparatuses may include a foldable display apparatus disclosed in Korean Patent Publication No. 10-2014-0015881 (hereinafter referred to as a prior art reference). The foldable display apparatus disclosed in the prior art reference unfolds a flexible display panel with respect to a hinge, thereby providing a large screen.

However, in the prior art reference, a crack occurs in a bending area of the flexible display panel due to a stress which is applied when the flexible display panel is repeatedly folded and unfolded with respect to the hinge, and for this reason, reliability of the flexible display panel of a display unit is reduced. That is, in the prior art reference, since one area and the other area of the flexible display panel is fully folded with respect to the bending area so as to contact each other, a crack easily occurs in the bending area of the flexible display panel.

SUMMARY OF THE INVENTION

Accordingly, the present invention is directed to a foldable display apparatus that substantially obviates one or more problems due to limitations and disadvantages of the related art. An embodiment of the present invention is directed to provide a foldable display apparatus for minimizing stress applied to a bending area of a display panel. Another embodiment of the present invention is directed to provide a foldable display apparatus in which a bending curvature of a foldable display panel is stably maintained, and the display panel is unfolded to a plane state.

In addition to the aforesaid objects of the present invention, other features and advantages of the present invention will be described below, but will be clearly understood by those skilled in the art from descriptions below. Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a foldable display apparatus including: a display panel configured to include a display area including a first display area, a second display area, and a bending area which is defined between the first and second display areas; a first panel supporting member configured to support a first area of the display panel corresponding to the first display area; a second panel supporting member configured to support a second area of the display panel corresponding to the second display area; and a folding part connected between the first and second panel supporting members to overlap the bending area, and configured to guide the display panel for the display panel to be folded or unfolded to a plane state with respect to the bending area, wherein the folding part adjusts a distance between the first and second panel supporting members for the display panel to be folded or unfolded. It is to be understood that both the foregoing general description and the following detailed description of the present invention are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the embodiments of the present invention, examples of which are illustrated in the accompanying drawings. Wherever possible, the same reference numbers will be used throughout the drawings to refer to the same or like parts.

The terms described in the specification should be understood as follows. As used herein, the singular forms "a", "an" and "the" are intended to include the plural forms as well, unless the context clearly indicates otherwise. The terms "first" and "second" are for differentiating one element from the other element, and these elements should not be limited by these terms. It will be further understood that the terms "comprises", "comprising", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including a situation where one element is formed at a top of another element and moreover a situation where a third element is disposed therebetween.

Figure 1:
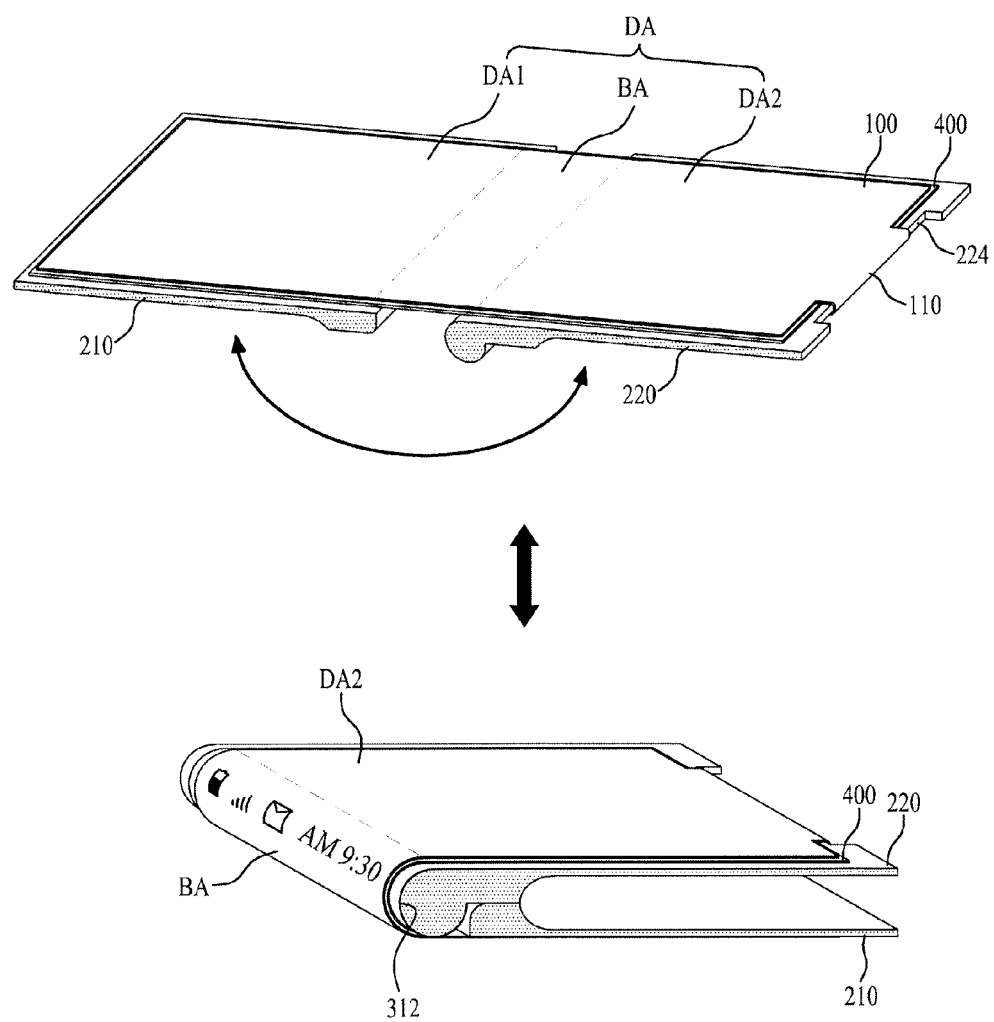
FIG. 1 is a diagram illustrating a folded state and an unfolded state in a foldable display apparatus according to an embodiment of the present invention.
Figure 2:
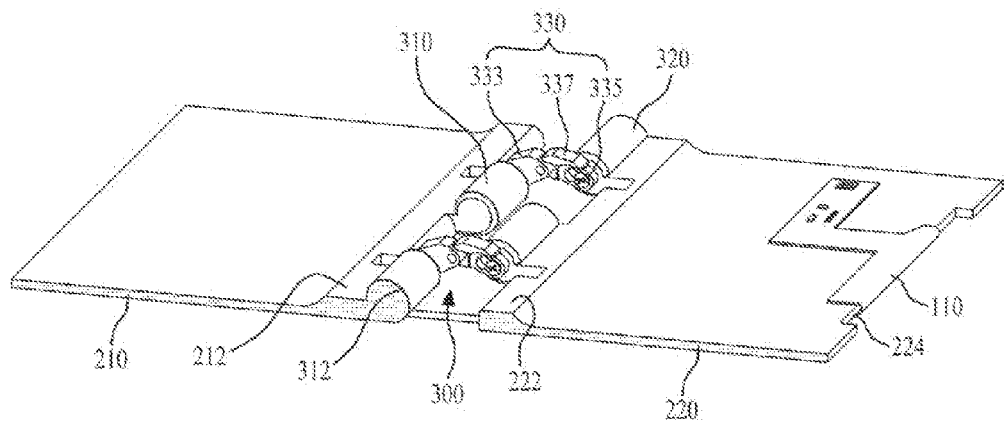
FIG. 2 is a perspective view illustrating a folding part of FIG. 1.
Figure 3:
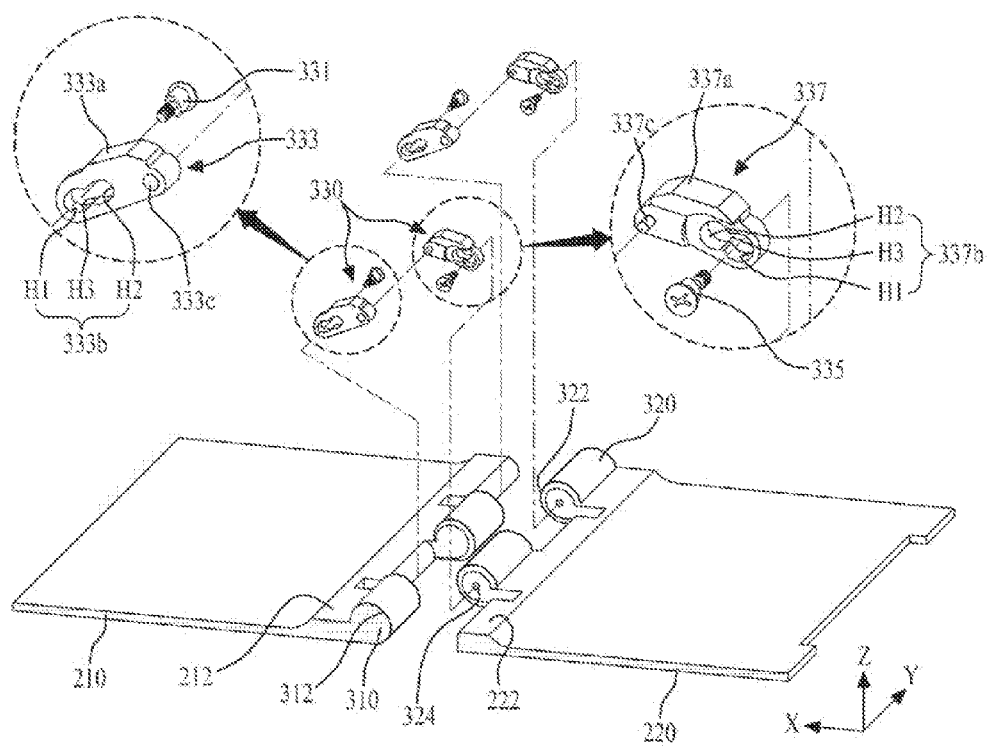
FIG. 3 is an exploded perspective view illustrating the folding part of FIG. 2.

Hereinafter, a foldable display apparatus according to embodiments of the present invention will be described in detail with reference to the accompanying drawings. FIG. 1 is a diagram illustrating a folded state and an unfolded state in a foldable display apparatus according to an embodiment of the present invention. FIG. 2 is a perspective view illustrating a folding part of FIG. 1. FIG. 3 is an exploded perspective view illustrating the folding part of FIG. 2.

Referring to FIGS. 1 to 3, the foldable display apparatus according to an embodiment of the present invention includes a display panel 100, first and second panel supporting members 210 and 220, and a folding part 300. The display panel 100 may be a flexible display panel using a flexible substrate. For example, the display panel 100 may be a flexible organic light emitting display panel, a flexible electrophoretic display panel, a flexible liquid crystal display panel, or a flexible electro-wetting display panel.

The display panel 100 may include a flexible substrate, which includes a pixel array including a plurality of pixels for displaying an image, and an encapsulating member that protects the pixel array. The flexible substrate may be formed of a plastic material or metal foil. For example, the flexible pixel array substrate formed of a plastic material may be formed of at least one selected from polyimide (PI), polyethyleneterephthalate (PET), polyethylenapthanate (PEN), polycarbonate (PC), polynorborneen (PNB), and polyethersulfone (PES).

Each of the plurality of pixels includes a display device that displays an image corresponding to an image signal. Here, the display device may be an organic light emitting device, a liquid crystal display device, an electrophoretic device, or an electro-wetting display device. The encapsulating member is formed on a flexible substrate to cover the pixel array, and may be a flexible encapsulating substrate or an encapsulating layer.

In addition, the display panel 100 may further include a polarizing film attached to the encapsulating member, but the polarizing film may be omitted for flexibility of the display panel 100. The foldable display apparatus according to an embodiment of the present invention may further include a touch screen for a user interface using a user's touch. The touch screen may be attached onto the display panel 100, or may be built into the display panel 100 during a process of forming the pixel array.

The display panel 100 includes a display area DA which includes the plurality of pixels, and the display area DA may be a display screen that displays a certain image according to driving of a panel driver. The display area DA may be divided into a first display area DA1, a second display area DA2, and a bending area BA.

When the display panel 100 is folded, the first and second display areas DA1 and DA2 may simultaneously or selectively display the same image or different images. In this instance, the same image or different images is/are simultaneously or selectively displayed on a front surface and a rear surface of the foldable display apparatus.

The bending area BA may be set as a partial area of the display area DA (for example, an area between the first and second display areas DA1 and DA2), for providing a bending part of the display panel 100 which has a certain curvature because the display panel 100 is bent when the display panel 100 is folded. The bending area BA may display a sub-image when the display panel 100 is folded. For example, when the foldable display apparatus according to an embodiment of the present invention is a portable information apparatus, the sub-image may be a remaining capacity of a battery, wireless communication sensitivity, time information, or a message reception icon. When the display panel 100 is unfolded, the bending area BA is provided as a flat type of area between the first and second display areas DA1 and DA2, and thus, the bending area BA and the first and second display areas DA1 and DA2 may constitute a single wide screen.

The display panel 100 includes a signal applying unit 110 which extends from one edge to have a certain width and length. A plurality of link lines, which are connected to signal lines provided in the pixel array, are provided in the signal applying unit 110. The signal applying unit 110 is bent toward a rear surface of the second panel supporting member 220 to surround an outer surface of the second panel supporting member 220, and is connected to the panel driver, thereby supplying a pixel driving signal and a data signal, supplied from the panel driver, to the pixel array. The first and second panel supporting members 210 and 220 may be formed of a metal or plastic material to have a tetragonal shape.

The first panel supporting member 210 supports a first area of the display panel 100, for example, the first area of the display panel 100 can include the first display area DAL. In this instance, a first protrusion 212 may be provided at an inner edge of the first panel supporting member 210 to have a certain height, and the other bottom of the first panel supporting member 210, in which the first protrusion 212 is not provided, may be stepped with respect to the first protrusion 212 and may be used as a first accommodation space in which a plurality of driving units (for example, a communication circuit, a power circuit, a battery, a control circuit, a memory, an operational circuit, etc.) necessary for driving the foldable display apparatus are accommodated.

The second panel supporting member 220 supports a second area of the display panel 100, for example, the second area of the display panel 100 can include the second display area DA2. In this instance, a second protrusion 222 may be provided at an inner edge of the second panel supporting member 220 to have a certain height, and the other bottom of the second panel supporting member 220, in which the second protrusion 222 is not provided, may be stepped with respect to the second protrusion 222 and may be used as a second accommodation space in which a panel driver for driving the display panel 100 is accommodated.

An outer edge of the second panel supporting member 220 includes a groove 224 which is provided to have a certain width and length. The groove 224 prevents the signal applying unit 110 from being exposed to the outside. That is, the signal applying unit 110 is bent to a rear surface of the second panel supporting member 220 to surround the groove 224 from the display panel 100, and is not exposed to the outside of an outer surface of the second panel supporting member 220.

The folding part 300 is connected between the first and second panel supporting members 210 and 220 to overlap the bending area BA of the display panel 100, and adjusts a distance between the first and second panel supporting members 210 and 220, thereby allowing the display panel 100 to be folded at a certain curvature or unfolded to a plane state with respect to the bending area BA. That is, when the display panel 100 is folded, the folding part 300 causes inner parts of the first and second panel supporting members 210 and 220 facing each other to overlap each other, thereby allowing the bending area BA to be bent at a certain curvature. Also, when the display panel 100 is unfolded, the folding part 300 separates the first panel supporting member 210 from the second panel supporting member 220, thereby allowing the bending area BA to be unfolded to a plane state.

The folding part 300 according to an embodiment may include one or more first rotation shafts 310, one or more second rotation shafts 320, and a cam link part 330. Here, each of the first and second rotation shafts 310 and 320 may be provided as one, but may be provided in plurality in order for the display panel 100 to be more stably unfolded or folded.

The plurality of first rotation shafts 310 are arranged at certain intervals on an inner surface of the first panel supporting member 210. Each of the plurality of first rotation shafts 310 includes a first rounding part 312 which is provided at a certain curvature. When the display panel 100 is folded, the first rounding part 312 guides bending of the bending area BA to be bent at a predetermined curvature, and supports the bending area BA in order for a curvature of the bent bending area BA to be stably maintained. That is, the first rounding part 312 is provided to have the same curvature and supports the bent bending area BA, thereby preventing the bent bending area BA from being bent or pressed by an external force. The plurality of first rotation shafts 310 may be provided in a cylindrical shape having a length parallel to the inner surface of the first panel supporting member 210.

The plurality of second rotation shafts 320 are arranged at certain intervals on an inner surface of the second panel supporting member 220 to cross the plurality of first rotation shafts 310. That is, the plurality of second rotation shafts 320 are arranged at certain intervals on the inner surface of the second panel supporting member 220 so as to enable the plurality of second rotation shafts 320 to be respectively inserted into the plurality of first rotation shafts 310. The plurality of second rotation shafts 320 are provided in the same shape as that of the first rotation shaft 310, and includes a second rounding part 322 which is provided at a certain curvature. Therefore, when the display panel 100 is folded, the second rounding part 322 guides bending of the bending area BA to be bent at a predetermined curvature, and supports the bent bending area BA in order for a curvature of the bent bending area BA to be stably maintained.

The cam link part 330 is connected between the first and second rotation shafts 310 and 320, and overlaps the first rotation shaft 310 with the second rotation shaft 320 or separates the first rotation shaft 310 from the second rotation shaft 320 according to rotation of the first and second rotation shafts 310 and 320, thereby allowing the display panel 100 to be folded or unfolded.

The cam link part 330 according to an embodiment may include a first cam 331, a first link 333, a second cam 335, and a second link 337. The first cam 331 is coupled to one side of the first rotation shaft 310, and rotates along with the first rotation shaft 310. For example, the first cam 331 may include a cam bolt including an elliptical pillar, and may be coupled to a first coupling hole which is provided at the one side of the first rotation shaft 310. As another example, the first cam 331 may be an elliptical pillar which protrudes from the one side of the first rotation shaft 310 to a certain height to have an elliptical cross-sectional surface. A long-axis direction of the first cam 331 may be parallel to a direction Z vertical to a length direction X of the first panel supporting member 210.

The first link 333 guides a rotation and a movement of the first cam 331, and rotates according to a movement of the first cam 331, thereby allowing the display panel 100 to be folded or unfolded. The first link 333 according to an embodiment may include a first link body 333a, a first cam guide hole 333b, and a shaft hole 333c. The first link body 333a may be provided to have a certain length, and may include a stepped portion and a groove so as not to obstruct a rotation of the first rotation shaft 310.

The first cam guide hole 333b is provided at one side of the first link body 333a to pass through the first link body 333a in a thickness direction, and guides a rotation and a movement of the first cam 331. The first cam guide hole 333b according to an embodiment may include first and second cam rotation holes H1 and H2, which are provided in parallel in one area of the first link body 333a and into which the first cam 331 is rotatably inserted, and a hole communication part H3 which communicates the first cam rotation hole H1 with the second cam rotation hole H2 so that the first cam 331 disposed in the first cam rotation hole H1 or the second cam rotation hole H2 is selectively moved according to a rotation angle. For example, the first cam rotation hole H1 and the second cam rotation hole H2 are provided in parallel to have a greater diameter than a long-axis diameter of the first cam 331, and a central portion of the first cam rotation hole H1 is separated from a central portion of the second cam rotation hole H2 by a smaller distance than a diameter of the first cam rotation hole H1 or the second cam rotation hole H2, whereby the first cam rotation hole H1 and the second cam rotation hole H2 overlap each other to communicate with each other. Therefore, the hole communication part H3 is an area in which the first cam rotation hole H1 overlaps the second cam rotation hole H2, and an interval between a bottom and a top of the hole communication part H3 is greater than a short-axis diameter of the first cam 331 which is less than a long-axis diameter of the first cam 331. Therefore, the first cam 331 is rotatable in the first cam rotation hole H1 or the second cam rotation hole H2, and is selectively moved between the first cam rotation hole H1 and the second cam rotation hole H2 through the hole communication part H3 according to a rotation angle based on a rotation of the first rotation shaft 310 in a long-axis direction.

The shaft hole 333c may be provided to pass through the other side opposite to one side of the first link body 333a in a thickness direction. The shaft hole 333c may be a rotation center axis of the first link 333 which rotates according to a movement of the first cam 331. The first link 333 may include a shaft groove instead of the shaft hole 333c. The shaft groove may be recessed from the other side of the first link body 333a to a certain depth, with respect to a length direction of the first link body 333a.

The second cam 335 is coupled to one side of the second rotation shaft 320 facing one side of the first rotation shaft 310, and rotates along with the second rotation shaft 320. For example, the second cam 335 may include a cam bolt including an elliptical pillar, and may be coupled to a second coupling hole 324 which is provided at the one side of the second rotation shaft 320. As another example, the second cam 335 may be an elliptical pillar which protrudes from the one side of the second rotation shaft 320 to a certain height to have an elliptical cross-sectional surface. A long-axis direction of the second cam 335 may be parallel to the direction Z vertical to a length direction X of the second panel supporting member 220.

The second link 337 guides a rotation and a movement of the second cam 335, and rotates according to a movement of the second cam 335, thereby allowing the display panel 100 to be folded or unfolded. The second link 337 according to an embodiment may include a second link body 337a, a second cam guide hole 337b, and a shaft 337c. The second link body 335a may be provided to have a certain length, and may include a stepped portion and a groove so as not to obstruct a rotation of the second rotation shaft 320.

The second cam guide hole 337b is provided at one side of the second link body 337a to pass through the second link body 337a in a thickness direction, and guides a rotation and a movement of the second cam 335. The second cam guide hole 337b according to an embodiment may include first and second cam rotation holes H1 and H2, which are provided in parallel in one area of the second link body 337a and into which the second cam 335 is rotatably inserted, and a hole communication part H3 which communicates the first cam rotation hole H1 with the second cam rotation hole H2 so that the second cam 335 disposed in the first cam rotation hole H1 or the second cam rotation hole H2 is selectively moved according to a rotation angle. The first cam rotation hole H1, the second cam rotation hole H2, and the hole communication part H3 are described above, and thus, their detailed descriptions are not repeated. Therefore, the second cam 335 is rotatable in the first cam rotation hole H1 or the second cam rotation hole H2, and is selectively moved between the first cam rotation hole H1 and the second cam rotation hole H2 through the hole communication part H3 according to a rotation angle based on a rotation of the second rotation shaft 320 in a long-axis direction.

The shaft 337c protrudes from the other side opposite to one side of the second link body 337a to a certain height to have a cylindrical shape so that the shaft 337c is rotatably inserted into the shaft hole 333c (or a shaft groove) which is provided at the first link 333. The shaft 337c may be a rotation center axis of the second link 335 which rotates according to a movement of the second cam 335. Therefore, the first and second links 333 and 337 rotate with the shaft 337c as a rotation center axis according to a movement of each of the first and second cams 331 and 335. In this instance, the first and second links 333 and 337 are separated from each other with respect to the shaft 337c when the display panel 110 is unfolded. Further, when the display panel 100 is folded, the first and second links 333 and 337 overlap each other to cross with respect to the shaft 337c, and the plurality of first and second rotation shafts 210 and 220 overlap each other to cross.

In the second link 337, the shaft 337c may be replaced by a shaft pin. In this instance, the shaft pin passes through the other side of the second link body 337a, is inserted into the shaft hole 333c (or a shaft groove) which is provided at the first link 333, and acts as a rotation center axis.

Referring again to FIG. 1, the foldable display apparatus according to an embodiment of the present invention may further include a base plate 400 which is provided between the first and second panel supporting members 210 and 220 and supports the display panel 100. The base plate 400 is coupled to a top of each of the first and second panel supporting members 210 and 220 to cover the folding part 300, and supports the display panel 100. The base plate 400 may be formed of a flexible plastic material, or may be formed of a flexible metal material for dissipating the heat of the display panel 100.

The display panel 100 is disposed on the base plate 400. When the display panel 100 is attached and fixed to a whole top of the base plate 400, a length may be changed when the bending area BA is bent, and for this reason, partial detachment can occur in the bending area BA of the unfolded display panel 100. Therefore, in order to prevent or minimize the partial detachment of the bending area BA caused by a length change of the display panel 100, only one side or the other side of the display panel 100 may be attached or coupled to a top of the base plate 400. Likewise, only one side or the other side of the display panel 100 may be attached or coupled to a top of the first panel supporting member 210 or the second panel supporting member 220.

The foldable display apparatus according to an embodiment of the present invention may further include an external case which surrounds an outer surface of each of the first and second panel supporting members 210 and 220 and surrounds a front edge of the display panel 100. The external case may include first and second external lower cases which surround outer surfaces of first and second panel supporting members 210 and 220 except both sides of the bending area BA, first and second external front cases which surround a front edge of the display panel 100 except the bending area BA, and a hinge case which surrounds a lower portion and both sides of the bending area BA is formed of a flexible material which is bent when the display panel 100 is folded or unfolded. Also, each of the first and second external lower cases may include a folding opening/closing member, such as a hook, for maintaining or releasing a folded state of the display panel 100.

Figure 4:
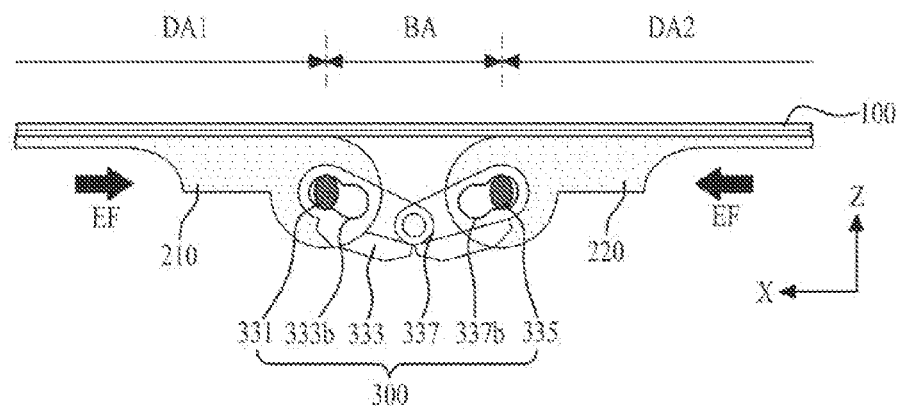
FIG. 4 is a diagram illustrating a unfolded state of a foldable display apparatus according to an embodiment of the present invention.

FIG. 4 is a diagram illustrating an unfolded state of a foldable display apparatus according to an embodiment of the present invention. As seen in FIG. 4, when the display panel 100 is unfolded, the first display area DA1, second display area DA2, and bending area BA of the display panel 100 are unfolded to a plane state. At this time, the first and second panel supporting members 210 and 220 are separated from each other by a certain distance by the folding part 300, and thus, the bending area BA is unfolded to a plane state. In a state where the display panel 100 is unfolded, since a long-axis direction of each of the first and second cams 331 and 335 is parallel to the direction Z vertical to a length direction X of the first and second panel supporting members 210 and 220, the first and second cams 331 and 335 are rotatable in the respective cam guide holes 333b and 337b, but are not moved between the first and second cam rotation holes of the cam guide holes 333b and 337b. Therefore, in a state where the display panel 100 is unfolded, although an external force EF is applied in the length direction X of the first and second panel supporting members 210 and 220, a movement of each of the first and second cams 331 and 335 is restricted by a hole communication part of each of the cam guide holes 333b and 337b, and thus, the display panel 100 stably maintains a state of being unfolded to a plane state.

Figure 5A:
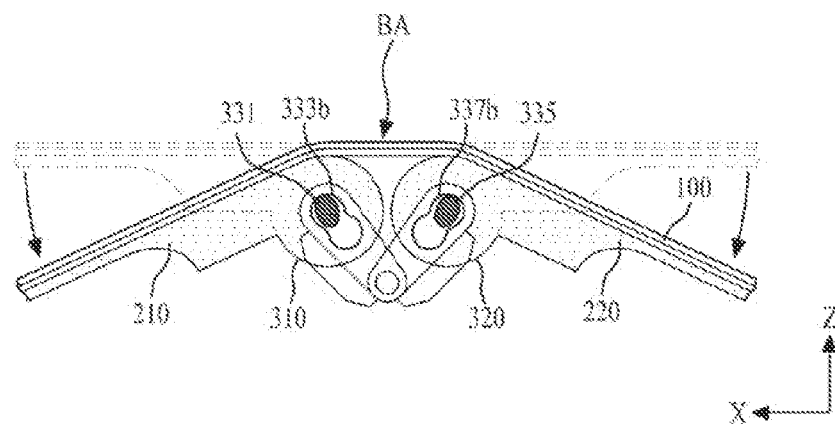
FIGS. 5A to 5C are diagrams illustrating a bending operation of a display panel in a foldable display apparatus according to an embodiment of the present invention.
Figure 5B:
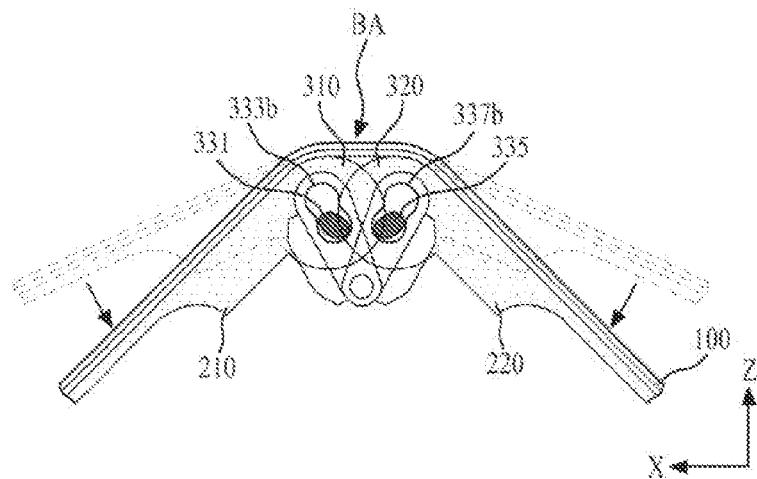
Figure 5C:
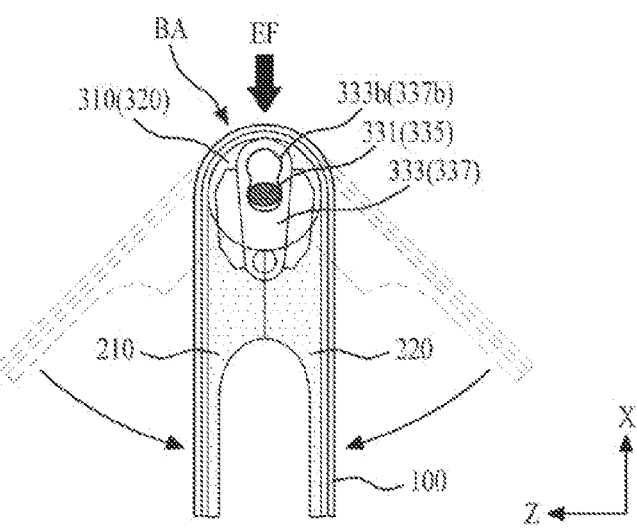

FIGS. 5A to 5C are diagrams illustrating describing a bending operation of a display panel in a foldable display apparatus according to an embodiment of the present invention. In the following description, only a bending operation of the display panel will be described.

First, in a state where the display panel 100 is unfolded to a plane state as illustrated in FIG. 4, when the first and second panel supporting members 210 and 220 rotate in a direction where the display panel 100 is folded, as illustrated in FIG. 5A, the first and second cams 331 and 335 rotate along with rotations of the first and second rotation shafts 310 and 320 according to rotations of the first and second panel supporting members 210 and 220, respectively. Therefore, the first and second cams 331 and 335 rotate in the respective first holes of the cam guide holes 333b and 337b, and are movable in the respective cam guide holes 333b and 337b. That is, when the first and second cams 331 and 335 rotate, one side of the first and second cams 331 and 335 in a long-axis direction are respectively inserted into the hole communication parts of the cam guide holes 333b and 337b. Simultaneously, as the first and second rotation shafts 310 and 320 rotate, the bending area BA of the display panel 100 starts to be bent according to the bending guide of the first and second rotation shafts 310 and 320.

Subsequently, as illustrated in FIG. 5B, when the first and second panel supporting members 210 and 220 further rotate in a direction where the display panel 100 is folded, the first and second cams 331 and 335 rotate according to rotations of the first and second rotation shafts 310 and 320, and move in a direction from a first hole to a second hole through the respective hole communication parts of the cam guide holes 333b and 337b. Simultaneously, as the first and second rotation shafts 310 and 320 rotate, the bending area BA of the display panel 100 is additionally bent according to the bending guide of the first and second rotation shafts 310 and 320.

Subsequently, as illustrated in FIG. 5C, when the first and second panel supporting members 210 and 220 further rotate in a direction where the display panel 100 is folded and overlap each other, the first and second rotation shafts 310 and 320 rotate to overlap each other, and thus, the first and second links 333 and 337 overlap each other. Therefore, as the first and second rotation shafts 310 and 320 rotate to overlap each other, the bending area BA of the display panel 100 is bent to have a curvature corresponding to a curvature of the rounding part which is provided at each of the first and second rotation shafts 310 and 320. Simultaneously, the first and second cams 331 and 335 rotate in respective second holes of the earn guide holes 333b and 337b, and thus, a long-axis direction of each of the first and second cams 331 and 335 is parallel to the direction Z vertical to the length direction X of the first and second panel supporting members 210 and 220. Therefore, the first and second cams 331 and 335 are rotatable in the respective second holes of the cam guide holes 333b and 337b, but are not moved in the cam guide holes 333b and 337b. Thus, in a state where the display panel 100 is folded with respect to the bending area BA, although the external force EF is applied to the bending area BA, a movement of each of the first and second cams 331 and 335 is restricted by the hole communication part of each of the cam guide holes 333b and 337b, and thus, the bent bending area BA of the display panel 100 is supported by the rounding part of each of the first and second rotation shafts 310 and 320, thereby stably maintaining a state of being bent at a certain curvature.

As described above, according to the embodiments of the present invention, the bending area of the display panel is not fully folded to contact one side with the other side, and is bent at a certain curvature, thereby minimizing a stress applied to the bending area of the display panel. Accordingly, a crack which occurs in the bending area is prevented or minimized, and thus, the reliability of the display panel can be enhanced.

Moreover, according to the embodiments of the present invention, an interval between the first and second panel supporting members is adjusted by the folding part which is connected between the first and second panel supporting members supporting the display panel, and thus, the display panel is bent at a certain curvature or is unfolded to a plane state.

Moreover, according to the embodiments of the present invention, the bending area of the display panel which is bent at a certain curvature is supported by the folding part, and thus, a constant curvature of the bent bending area can be maintained.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A foldable display apparatus comprising:
a display panel configured to include a display area including a first display area, a second display area, and a bending area which is defined between the first and second display areas;
a first panel supporting member configured to support the first display area;
a second panel supporting member configured to support the second display area; and
a folding part connected between the first and second panel supporting members to overlap the bending area, and configured to guide the display panel to be folded or unfolded to a plane state with respect to the bending area,
wherein the folding part adjusts a distance between the first and second panel supporting members for the display panel to be folded or unfolded,
wherein, when the display panel is folded, the folding part causes inner parts of the first and second panel supporting members facing each other to overlap each other, and when the display panel is unfolded, the folding part separates the inner part of the first panel supporting member from the inner part of the second panel supporting member for the bending area to be unfolded to a plane state, and
wherein the folding part comprises:
a first rotation shaft provided at an inner surface of the first panel supporting member,
a second rotation shaft provided at an inner surface of the second panel supporting member to cross the first rotation shaft, and
a cam link part connected between the first and second rotation shafts, and configured to overlap the first rotation shaft with the second rotation shaft.

2. The foldable display apparatus of claim 1, wherein,
each of the first and second rotation shafts comprises a rounding part provided to have a certain curvature, and when the display panel is folded, the rounding part of each of the first and second rotation shafts guides bending of the bending area, and supports the bending area which is bent at a certain curvature.

3. The foldable display apparatus of claim 1, wherein the cam link part comprises:
- a first cam provided at one side of the first rotation shaft;
- a first link configured to rotatably, movably support the first cam;
- a second cam provided at one side of the second rotation shaft parallel to one side of the first rotation shaft; and
- a second link configured to rotatably, movably support the second cam, and foldably coupled to the first link.

4. The foldable display apparatus of claim 3, wherein the first and second links are folded or unfolded according to rotations and movements of the first and second cams.

5. The foldable display apparatus of claim 4, wherein,
- each of the first and second links comprises a cam guide hole into which a corresponding cam is rotatably, movably inserted, and
- each of the first and second cams is selectively moved in a corresponding cam guide hole according to a rotation angle of the corresponding cam.

6. The foldable display apparatus of claim 5, wherein each of the first and second cams comprises an elliptical cross-sectional surface.

7. The foldable display apparatus of claim 6, wherein, the cam guide hole comprises:
- first and second cam rotation holes arranged in parallel, wherein the corresponding cam is rotatably inserted into the first and second cam rotation holes; and
- a hole communication part configured to communicate the first cam rotation hole with the second cam rotation hole, and
- the corresponding cam is selectively moved between the first and second cam rotation holes through the hole communication part according to a rotation angle of the corresponding cam.

8. The foldable display apparatus of claim 7, wherein the first cam rotation hole is separated from a central portion of the second cam rotation hole by a distance smaller than a diameter of the first rotation hole and a diameter of the second cam rotation hole.

9. The foldable display apparatus of claim 8, wherein the first cam rotation hole overlaps the second cam rotation hole.

10. The foldable display apparatus of claim 7, wherein,
- in a state where the display panel is folded, the hole communication part is configured to stably maintain the state where the display panel folded by restricting a movement of the corresponding cam.

11. The foldable display apparatus of claim 7, wherein,
- in a state where the display panel is unfolded, the hole communication part is configured to stably maintain the state where the display panel unfolded by restricting a movement of the corresponding cam.

12. The foldable display apparatus of claim 6, wherein,
- in a state where the display panel is folded or unfolded, each of the first and second cams is not moved between the first and second cam rotation holes, and
- while the display panel is folded or unfolded, each of the first and second cams is moved between the first and second cam rotation holes through the hole communication part.

13. The foldable display apparatus of claim 3, wherein the first and second links are separated from each other when the display panel is unfolded and overlap each other when the display panel is folded.

14. The foldable display apparatus of claim 1, further comprising:
- a flexible base plate provided between the first and second panel supporting members and configured to support the display panel, wherein only one side of the display panel is attached to a top of the flexible base plate.

* * * * *